(12) United States Patent
Hunter et al.

(10) Patent No.: US 7,423,488 B2
(45) Date of Patent: Sep. 9, 2008

(54) SYSTEM AND METHOD FOR COMPENSATING FOR THE EFFECTS OF AGING AND TEMPERATURE ON TRANSISTOR PERFORMANCE

(75) Inventors: Jeffrey K. Hunter, Olathe, KS (US); Timothy P. Gibson, Overland Park, KS (US); Adam C. Eckhardt, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 204 days.

(21) Appl. No.: 11/293,368

(22) Filed: Dec. 5, 2005

(65) Prior Publication Data

US 2007/0126509 A1   Jun. 7, 2007

(51) Int. Cl.
*H03F 3/04* (2006.01)
(52) U.S. Cl. ........................ 330/289; 330/296
(58) Field of Classification Search ............. 330/289, 330/296
See application file for complete search history.

(56) References Cited

U.S. PATENT DOCUMENTS

| | | | |
|---|---|---|---|
| 4,158,180 A | 6/1979 | Challen | |
| 4,313,210 A | 1/1982 | Hume et al. | |
| 5,923,215 A | 7/1999 | Hans | |
| 5,994,965 A * | 11/1999 | Davis et al. | ............... 330/295 |
| 6,417,732 B1 | 7/2002 | Radomski et al. | |
| 6,778,018 B2 * | 8/2004 | Joly et al. | ................ 330/296 |
| 7,167,055 B2 * | 1/2007 | Wong et al. | ................ 330/298 |
| 7,215,204 B2 * | 5/2007 | Bambridge et al. | ......... 330/307 |
| 2004/0111574 A1 | 6/2004 | Pina et al. | |
| 2005/0206447 A1 * | 9/2005 | Yamazaki et al. | ........... 330/129 |

FOREIGN PATENT DOCUMENTS

| | | |
|---|---|---|
| DE | 19718109 A1 | 11/1997 |
| EP | 1521359 A1 | 4/2005 |

OTHER PUBLICATIONS

Kolbe, Werner, European Search Report, European Patent Office, Dec. 18, 2007, Munich.

* cited by examiner

*Primary Examiner*—Patricia Nguyen
(74) *Attorney, Agent, or Firm*—Black Lowe & Graham PLLC

(57) ABSTRACT

Disclosed is a system and method for compensating for the effects of aging and temperature on the performance of transistors in an RF transmitter. The system and method use a temperature-based polynomial and a feedback control loop to correlate the drain current of each transistor with the desired performance characteristics of each transistor. The present invention measures drain current and temperature of the transistor; compares the measured drain current with the desired drain current, which corresponds to the desired performance characteristics; computes a transistor bias voltage based on the temperature and a control parameter, wherein the control parameter is adjustable based on the measured drain current; and applies the bias voltage to the transistor. The process may be repeated, with the control parameter adjusted with each iteration, until the desired drain current is reached.

15 Claims, 2 Drawing Sheets

SYSTEM AND METHOD FOR COMPENSATING FOR THE EFFECTS OF AGING AND TEMPERATURE ON TRANSISTOR PERFORMANCE

BACKGROUND OF THE INVENTION

1. Field of the Invention

The present invention involves the field of radio communications. More particularly, the present invention involves a radio transmitter that compensates for the effects of aging and temperature on the transistors within the radio transmitter.

2. Discussion of the Related Art

Radio Frequency (RF) communication is becoming more ubiquitous with the proliferation of miniaturized electronics and more sophisticated digital signal processing techniques. More RF communications subsystems are being deployed in environments, such as aircraft, whereby more information may be communicated and processed in an automated fashion. In the case of aircraft, communication schemes such as VDL (VHF Data Link) provide automated communication of aircraft status and navigation information to air traffic controllers without encumbering the air crew. Such communication schemes enable global air traffic management systems to have timely information regarding the location and status of aircraft.

Communication schemes such as VDL require additional RF communications links between the aircraft and the air traffic control system. Accordingly, aircraft employing VDL require additional RF transmitters.

Integrating additional RF transmitters into an aircraft requires consideration of available mass, space, and power. Further, there is considerable motivation to minimize the cost of additional RF transmitters.

Given the high data rates of modern communication schemes such as VDL, rigorous requirements are placed on an RF transmitter. An RF transmitter must perform consistently with regard to output power, gain, linearity, inter-stage matching, and adjacent channel power (hereinafter "performance characteristics"). Unfortunately, the transistors within an RF transmitter are susceptible to changes in performance characteristics, depending on their temperature and age. Age-induced changes in performance characteristics generally result from increased gate leakage and changes in drain-source resistance, which are primarily due to the gradual introduction of defects in the crystalline structure of the drain-source channel.

It is possible to compensate for changes in the transistor to maintain its performance characteristics. In the case of Field Effect Transistors (FETs), changes in performance characteristics may be compensated by adjusting the bias voltage across the gate and the source (Vgs) of the FET. Similar bias adjustments may be made to compensate for changes in performance characteristics of other types of transistors.

Related art solutions for maintaining performance characteristics of the transistors include the use of RF feedback in a closed loop control implementation. In RF feedback, an RF transmitter monitors its own RF output power. An embedded processor or analog circuit compares the expected RF output with the measured RF output and adjusts the transmitter accordingly.

Problems with the related art solution include the following. First, additional hardware is needed to monitor RF output power, which increases the mass, space, power consumption, and cost of the RF transmitter. Factors such as space, mass and power consumption are critical in aircraft-based applications. Second, for applications involving complex modulation, the real-time closed loop control implementation is generally computationally intensive and either requires considerable processor resources, or requires complex analog circuitry.

Accordingly, there is a need for an RF transmitter, which compensates for the effects of aging and temperature on the performance characteristics of its transistors, while substantially minimizing size, mass, power consumption, cost, and complexity.

SUMMARY OF THE INVENTION

Accordingly, the present invention is directed to a system and method for compensating for the effects of aging and temperature on transistor performance that substantially obviates one or more of the problems due to limitations and disadvantages of the related art.

An advantage of the present invention is that it reduces the cost and complexity of an RF transmitter.

Another advantage of the present invention is that it reduces the power, mass, and space requirements for an RF transmitter.

Additional features and advantages of the invention will be set forth in the description which follows, as well as the appended drawings. In accordance with one aspect of the present invention, these and other advantages are achieved by a method for maintaining performance of a transistor. The method comprises measuring a current corresponding to the transistor; measuring a temperature corresponding to the transistor; determining if the current is within a desired current range; computing a bias based on the current, the temperature, and a control parameter; and applying the bias to the transistor.

In another aspect of the present invention, the aforementioned advantages are achieved by a system for maintaining a transistor performance. The system comprises a transistor; a current sensor connected to the transistor; a temperature sensor; and a processor connected to the transistor, the current sensor, and the temperature sensor, the processor having a computer readable medium encoded with a program for obtaining a current measurement from the current sensor; obtaining a temperature measurement from the temperature sensor; determining if the current measurement is within a desired current range; computing a bias as a function of the current measurement, the temperature measurement, and a control parameter; and applying the bias to transistor.

In another aspect of the present invention, the aforementioned advantages are achieved by a computer readable medium encoded with a program for maintaining performance of a transistor in a system. The program comprises a program for measuring a current corresponding to the transistor; a program for measuring a temperature corresponding to the transistor; a program for determining if the current is within a desired current range; a program for computing a bias based on the current, the temperature, and a control parameter; and a program for applying the bias to the transistor.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
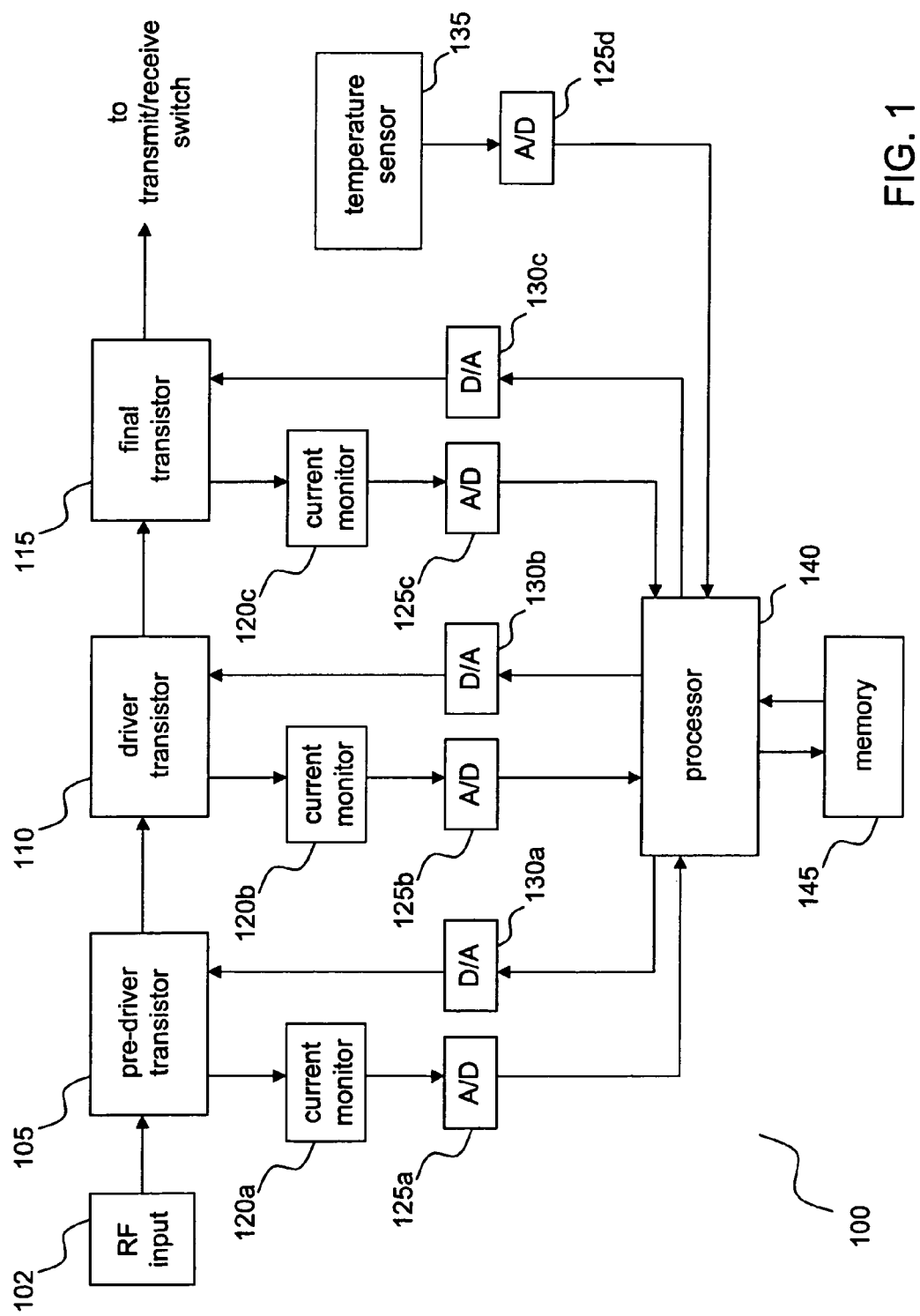
FIG. 1 illustrates an exemplary subsystem of an RF transmitter according to the present invention.

FIG. 1 illustrates an exemplary subsystem 100 of an RF transmitter according to the present invention. Exemplary RF transmitter subsystem 100 may be integrated into an RF transmitter for use in any of a number of RF applications, such as aircraft communication systems, cell phones, wireless computing devices, RF identification systems, satellite communications terminals, etc. Exemplary RF transmitter subsystem 100 includes a pre-driver transistor 105, which may be a FET, such as a power MOSFET or an LDMOS FET; a transistor current monitor 120a connected to the pre-driver transistor 105 in such a way as to measure a current related to the pre-driver transistor 105; an analog to digital (A/D) converter 125a connected to the transistor current monitor 120a; and a digital to analog (D/A) converter 130a connected to the pre-driver transistor 105 in such a way that the analog voltage from the D/A converter 130a provides a bias voltage to the pre-driver amplifier 105.

The RF transmitter subsystem 100 further includes a driver transistor 110, which may be connected to a transistor current monitor 120b and a D/A converter 130b in a substantially similar manner as described above regarding pre-driver transistor 105. The transistor current monitor 120b is connected to an A/D converter 125b. The RF transmitter subsystem 100 also has a final transistor 115, which is connected to a transistor current monitor 120c and a D/A converter 130c as described above. The transistor current monitor 120c is connected to A/D converter 125c.

RF transmitter subsystem 100 includes a temperature sensor 135, which may be disposed in the vicinity of the final transistor 115. The temperature sensor 135 is connected to an A/D converter 125d. The temperature sensor 135 may be selected from a variety of temperature sensing devices that may be interfaced to a computer, such as a semiconductor-based sensor, a thermistor, or a thermocouple. The temperature sensor 135 may include signal conditioning circuitry appropriate for providing a signal compatible with the A/D converter 125d.

Exemplary RF transmitter subsystem 100 includes a processor 140, which is connected to A/D converters 125a-d, D/A converters 130a-c, and a memory 145. The processor 140 may be an embedded processor, which is disposed on the same circuit board as transistors 105, 110, and 115. Alternatively, the processor 140 may be remotely located.

Memory 145 contains software (hereinafter "the software") for implementing processes associated with the present invention. The memory 145 may be disposed on the same circuit board as processor 140, or may be remotely accessible, such as a host database, that the processor 140 communicates with over a network connection. Memory 145 may contain other programs for performing other functions related to the operation of the RF transmitter.

It will be readily apparent to one of ordinary skill that many architectures for processor 140 and memory 145 are possible and within the scope of the present invention.

Variations of exemplary RF transmitter subsystem 100 are possible, including the following examples. The driver transistor 110 and the final transistor 115 may share a transistor current monitor 120b. There may be more or fewer transistors than those illustrated in FIG. 1. Each transistor may have a dedicated temperature sensor 135, which may be disposed directly on the casing of the respective transistor. If a FET is used, the transistor current monitor 120a, 120b, or 120c may measure the drain current (Id) of the transistor, and the bias voltage may be applied across the gate and source of the FET. Transistors other than FETs may be used, such as bipolar junction transistors (BJT). If a BJT is used, the collector current may be monitored instead of the drain current, and the bias voltage may be applied across the base and the emitter of the BJT. RF transmitter subsystem 100 may include a combination of FETs, BJTs, and other transistor types. One of ordinary skill will recognize that many such variations are possible and within the scope of the invention.

Figure 2:
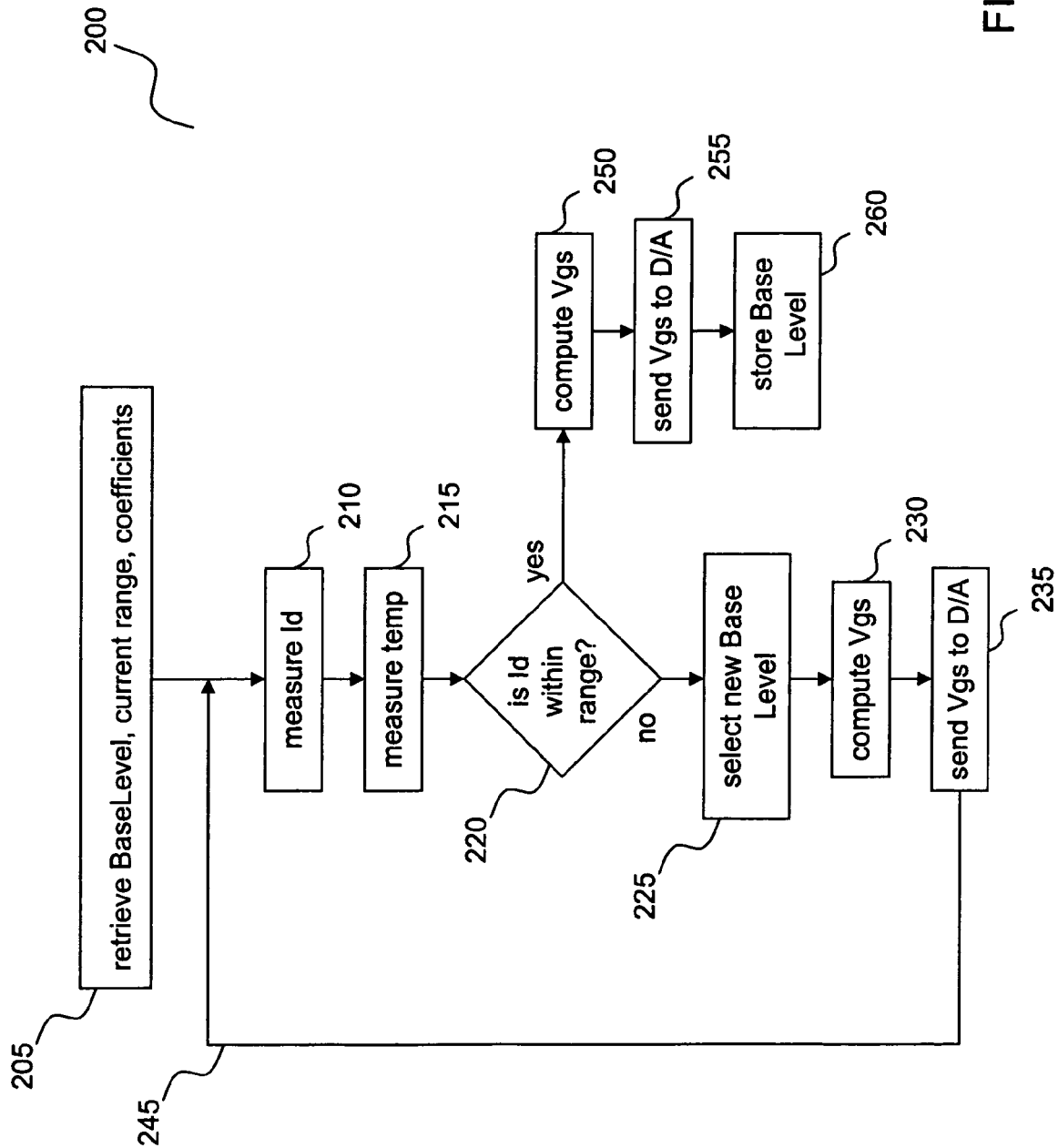
FIG. 2 illustrates an exemplary process for compensating for the effects of aging and temperature on the performance of transistors within an RF transmitter according to the present invention.

The software includes computer-readable code for implementing processes associated with the present invention. FIG. 2 illustrates an exemplary process 200 for maintaining transistor performance by compensating for the effects of aging and temperature on the performance of the transistor. The software may execute process 200 for each transistor 105, 110, and 115, individually. For the purposes of illustration, the following description of exemplary process 200 is for the pre-driver transistor 105, in which pre-driver transistor 105 is a FET. However, process 200 may apply to any other transistor is subsystem 100, and may also apply to other types of transistors (i.e., BJT, etc.) listed above. Process 200 includes loop 245. As used herein, "execution" refers to a single performance of process 200, and "iteration" refers to a single pass through loop 245.

In step 205, the software retrieves configuration data values for compensating a given transistor. The configuration data includes a desired transistor current range, which corresponds to optimal performance of the transistor, and parameter data for computing a bias voltage for the transistor according to the following equation:

$$\text{BiasControlLevel} = \text{BaseLevel} \cdot (A + B \cdot \text{temp} + C \cdot \text{temp}^2 + D \cdot \text{temp}^3 + E \cdot \text{temp}^4) \qquad (1)$$

where temp is the measured temperature; BaseLevel is a control parameter that may be adjusted; A-E are polynomial coefficients, and BiasControlLevel refers to the bias voltage that gets applied to the transistor. The values corresponding to parameters BaseLevel and BiasControlLevel are retrieved from memory in step 205.

The parameter values retrieved in step 205 may be derived and stored during a factory calibration process. When process 200 is executed for the first time, the BaseLevel value retrieved in step 205 may be the value set during factory calibration. Otherwise, the retrieved BaseLevel value may have been calculated by a previous execution of process 200.

In the factory calibration process, the required performance characteristics of each transistor are determined, and the drain current for each transistor is derived based on the performance characteristics. RF transmitter subsystem 100 is tested under different temperatures, and the coefficients A-E in equation (1) may be derived from the temperature data via any of a number of curve fitting algorithms.

Variations to equation (1) are possible and within the scope of the invention, provided that the equation relates the temperature-induced effects of the performance of a transistor to the bias voltage, and provided that the equation includes a parameter that can be adjusted. Variations to equation (1) may depend on the curve fitting algorithm used and the precision of the curve fit. For example, depending on the speed of processor 140 and the performance requirements of the RF transmitter, equation (1) may have fewer terms. One of ordinary skill will readily recognize that the particular form of equation (1) may depend on factors such as the performance requirements of the subsystem 100, its operating environment, and its power, mass, and space constraints.

Each transistor 105, 110, and 115 may have its own corresponding set of parameter values stored in memory 145. Alternatively, a single set of parameter values may be stored, which are applied to multiple (or all) transistors in subsystem 100.

In step 210, the software issues a command to the measure the current of pre-driver transistor 105. In doing so, the A/D converter 125a converts the most recent current reading by the transistor current monitor 120a from an analog reading into a digital reading. The software retrieves the digital current reading from the A/D converter 125a and stores the corresponding measured transistor current value in memory 145.

In step 215, the software issues a command to measure the temperature. In doing so, the A/D converter 125d converts the most recent temperature reading from the temperature sensor 135 from an analog reading into a digital reading. The software retrieves the digital temperature reading from A/D converter 125d and stores the corresponding value in memory 145.

In step 220, the software determines if the measured transistor current is within the desired transistor current range, which is among the configuration data values retrieved in step 205. If the measured transistor current is not within the desired transistor current range, the performance characteristics of the pre-driver transistor 105 are considered to be outside their respective optimal ranges. In accordance with the "NO" path out of decision step 220, exemplary process 200 performs an iteration of loop 245.

Further to step 220, the software may store the difference between the measured transistor current and the desired transistor current range. This information may be used in the subsequent selection of a new BaseLevel in step 225.

In step 225, the software selects a new BaseLevel value, which may be based on the previous BaseLevel value. The software may select a new BaseLevel according to a feedback-based approach. For example, for each iteration of loop 245 the new BaseLevel may be equal to the previous BaseLevel*F+(DesiredCurrent−measured transistor current)*G. The DesiredCurrent value may be at the center of the desired transistor current range, and F and G are parameters. After several iterations the difference between the DesiredCurrent and the measured transistor current may be reduced until the desired current is within the desired transistor current range. The values of parameters F and G may be determined in the factory calibration process, based on the needs of the system, and may be stored and retrieved along with the configuration data.

The software may select the BaseLevel value using any of a number of control and estimation schemes. It will be readily apparent to one of ordinary skill that many such approaches are possible and within the scope of the invention Alternatively, if multiple iterations of loop 245 have already been performed, the software may retrieve previously stored differences between previously measured transistor current values and the DesiredCurrent, along with corresponding previous BaseLevel values, and estimate a new BaseLevel accordingly. This method is commonly referred to as a look-up table implementation. This look-up table could also be based on temperature and may be used in place of the polynomial curve.

In step 230 the software computes a new Vgs value using equation (I) above, the new BaseLevel value, the parameter values retrieved in step 205 (excluding the stored BaseLevel value), and the temperature value measured in step 215.

In step 235, the software sends the new Vgs value to D/A converter 130a. D/A converter 130a converts the digital Vgs value into an analog voltage, which is then applied across the gate and source of the pre-driver transistor 105 as a bias voltage. During RF transmission, this bias voltage is added to the signal voltage, which is applied across the gate and source according to the RF input signal 102 to be amplified.

According to exemplary process 200, the software may repeatedly iterate loop 245 until the measured transistor current falls within the desired transistor current range.

If, during decision step 220, it is determined that the measured transistor current falls within the desired range, then the pre-driver transistor 105 is considered to be operating properly, and the performance characteristics of the pre-driver transistor 105 are considered to be in their respective optimal ranges. In accordance with the "YES" path out of decision step 220, the software proceeds to step 250, whereby it computes a new Vgs according to equation (1) above, using the most recent BaseLevel value, the parameter values (excluding the previous BaseLevel), and temperature measured in step 215. In step, 255, the software sends the new Vgs value to D/A converter 130a as described above. In step 260, the software stores the new BaseLevel value in memory 145. The software may store the new BaseLevel value along with the previous BaseLevel values.

Alternatively, in accordance with the "YES" path out of decision step 220, the software may store the BaseLevel in step 260 without performing steps 250 and 255.

Process 200 may be executed separately for each of the transistors, or may be done for all the transistors simultaneously. The software may store all of the values for measured Id, measured temperature, and BaseLevel for each execution of process 200 (for each transistor) and for each iteration of loop 245 within each execution of process 200.

In another variation, the maximum number of iterations of loop 245 may be predetermined. In this case, loop 245 might be iterated up to a maximum number of times, at which point the last calculated BaseLevel value will be used and stored. This variation may be required in time-critical applications, whereby the maximum amount of time allocated to the process of compensating for the effects of aging and temperature on transistor performance is constrained due to the operating environment of the RF transmitter.

Process 200 may be executed at different times during operation of the system in which the RF transmitter is deployed. For example, process 200 may be executed on initial power-up of the RF transmitter. In this case, each transistor within RF transmitter subsystem 100 may turned on in sequence, with process 200 being executed for each transistor sequentially as it is powered up. Further, process 200 may be executed for each transistor prior to each RF transmission. Process 200 may also be executed periodically during each RF transmission. Also, process 200 may be executed soon after the termination of each RF transmission. Additionally, process 200 may be executed based on a preset schedule.

Where a maximum number of iterations of loop 245 is set, if the BaseLevel values are stored for each execution of process 200, it is possible to converge on a BaseLevel that sets the measured transistor current within the desired transistor current range. By executing process 200 multiple times, it may have substantially the same effect as executing process 200 once for as many iterations of loop 245 necessary to have the measured transistor current within the desired range. Accordingly, depending on the time-critical requirements of the system in which the RF transmitter is operating, it is possible to compensate the transistors within RF transmitter subsystem 100 by temporally distributing iterations of loop 245.

Although the above disclosure pertains to RF transmitters, it will be readily apparent that the present invention may apply to various applications in which consistent performance by a transistor is desired.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for maintaining performance of a transistor, comprising:
    measuring a current corresponding to the transistor;
    measuring a temperature corresponding to the transistor;
    determining if the current is within a desired current range;
    selecting a new control parameter when the current is not within the desired current range, the selecting performed before computing a bias; and
    computing the bias based on the current, the temperature, and the new control parameter; and applying the bias to the transistor.

2. The method of claim 1, wherein measuring the current comprises measuring a drain current.

3. The method of claim 1, wherein computing the bias comprises computing the bias voltage based on a polynomial.

4. The method of claim 1, wherein computing the bias comprises computing the bias voltage based on a look-up table stored in a memory.

5. The method of claim 1, wherein applying the bias comprises applying the bias across a gate and a source of the transistor.

6. A system for maintaining a transistor performance, comprising:
    a transistor;
    a current sensor connected to the transistor;
    a temperature sensor; and
    a processor connected to the transistor, the current sensor, and the temperature sensor, the processor having a computer readable medium encoded with a program for:
        obtaining a current measurement from the current sensor;
        obtaining a temperature measurement from the temperature sensor;
        determining if the current measurement is within a desired current range;
        when the current is not within the desired current range, selecting a new control parameter, the selecting performed before computing a bias;
        computing the bias as a function of the current measurement, the temperature measurement, and the new control parameter; and
        applying the bias to transistor.

7. The system of claim 6, wherein the current sensor is connected to a drain of the transistor.

8. The system of claim 6, further comprising an analog to digital converter connected between the current sensor and the processor.

9. The system of claim 6, wherein the processor is connected to a gate of the transistor and a source on the transistor.

10. The method of claim 1, wherein the new control parameter is a new base level value corresponding to a base value of bias control for the transistor, further comprising determining a new base level value equal to a previous base level adjusted by a difference between a desired current and the measured transistor current.

11. The method of claim 10, wherein the new base level value is determined by:

$$\text{NewBaseLevel} = \text{the previous BaseLevel} * F + (\text{DesiredCurrent} - \text{the MeasuredTransistorCurrent})G,$$

where F and G are factory calibration parameters.

12. The method of claim 11, wherein the DesiredCurrent is at the center of a desired transistor current range.

13. The system of claim 6, wherein the new control parameter is a new base level value corresponding to a base value of bias control for the transistor, and wherein the program determines a new base level value equal to a previous base level adjusted by a difference between a desired current and the measured transistor current.

14. The system of claim 13, wherein the new base level value is determined by:

$$\text{NewBaseLevel} = \text{the previous BaseLevel} * F + (\text{DesiredCurrent} - \text{the MeasuredTransistorCurrent}) * G,$$

where F and G are factory calibration parameters.

15. The system of claim 14, wherein the DesiredCurrent is at the center of a desired transistor current range.

* * * * *

UNITED STATES PATENT AND TRADEMARK OFFICE
CERTIFICATE OF CORRECTION

PATENT NO. : 7,423,488 B2  Page 1 of 1
APPLICATION NO. : 11/293368
DATED : September 9, 2008
INVENTOR(S) : Jeffrey K. Hunter, Timothy P. Gibson and Adam C. Echhardt It is certified that error appears in the above-identified patent and that said Letters Patent is hereby corrected as shown below:

Claim 11, Column 8, Line 27, should read:

Current-the MeasuredTransistorCurrent)*G

Signed and Sealed this

Sixteenth Day of December, 2008

JON W. DUDAS
*Director of the United States Patent and Trademark Office*